United States Patent [19]
Singh et al.

[11] Patent Number: 5,694,049
[45] Date of Patent: Dec. 2, 1997

[54] SOCKETLESS BURN-IN BOARD

[75] Inventors: Inderjit Singh; Sukhbir Singh, both of Singapore, Singapore

[73] Assignee: Texas Instruments Incorporated, Dallas, Tex.

[21] Appl. No.: 402,409

[22] Filed: Mar. 10, 1995

Related U.S. Application Data

[63] Continuation of Ser. No. 123,275, Sep. 17, 1993, abandoned.
[51] Int. Cl.$^6$ ................................................. G01R 31/02
[52] U.S. Cl. ................................................. 324/755
[58] Field of Search ................................. 324/755, 765, 324/754; 29/845

[56] References Cited

U.S. PATENT DOCUMENTS

| | | |
|---|---|---|
| 4,535,536 | 8/1985 | Wyss ........................................ 324/754 |
| 4,899,107 | 2/1990 | Corbett et al. ........................... 324/765 |

*Primary Examiner*—Kenneth A. Wieder
*Assistant Examiner*—Russell M. Kobert
*Attorney, Agent, or Firm*—Rose Alyssa Keagy; Richard L. Donaldson

[57] ABSTRACT

Burn-in module 120 contains a lower socketless board 230 and an upper socketless board 240. Device sitting positions 210, or a high temperature resistant sheet 610 perform the socket functions of holding the device 400 laterally in place and routing test signals to the device 400. The lower socketless board 230 has electrical leads which carry test signals from the oven circuitry 140 to the plurality of device positions 210. The lower socketless board 230 is fastened to the upper socketless board 240 by a connector 220. If the upper socketless board 240 is modified to contain electrical leads then connector 220 may also act as an electrical connector and carry electrical signals from the lower socketless board 230 to the upper socketless board 240.

8 Claims, 8 Drawing Sheets

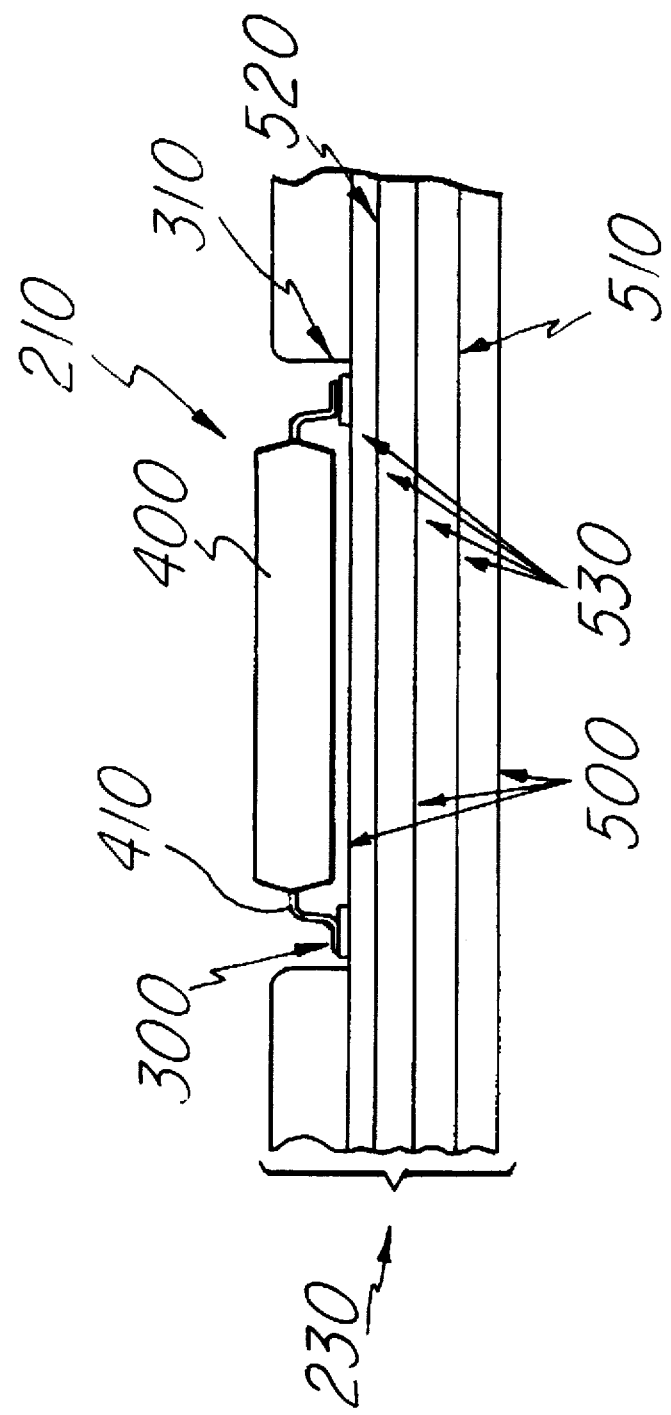

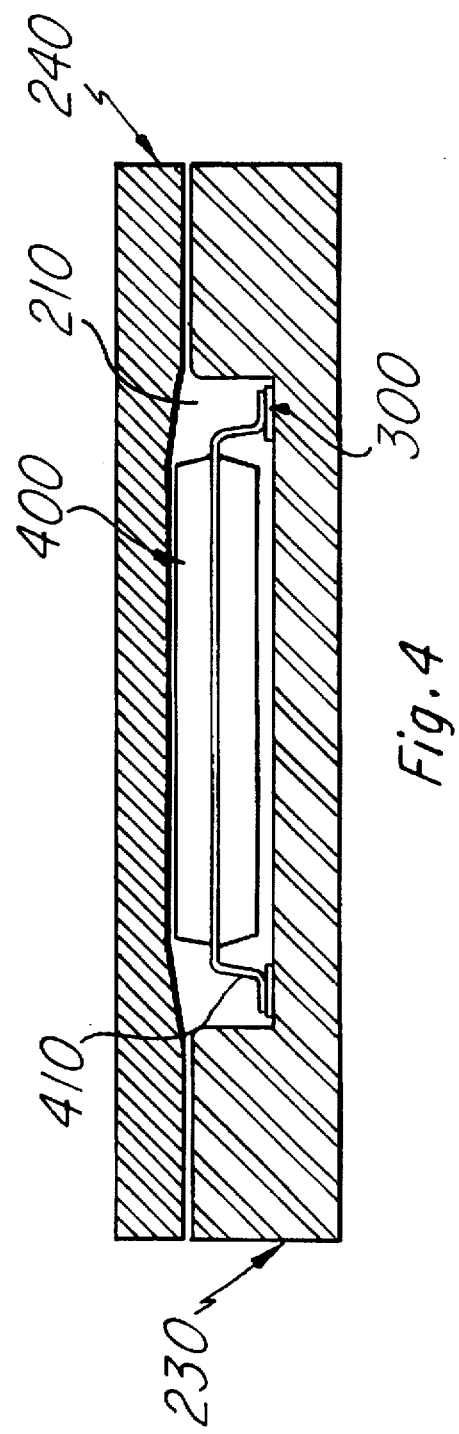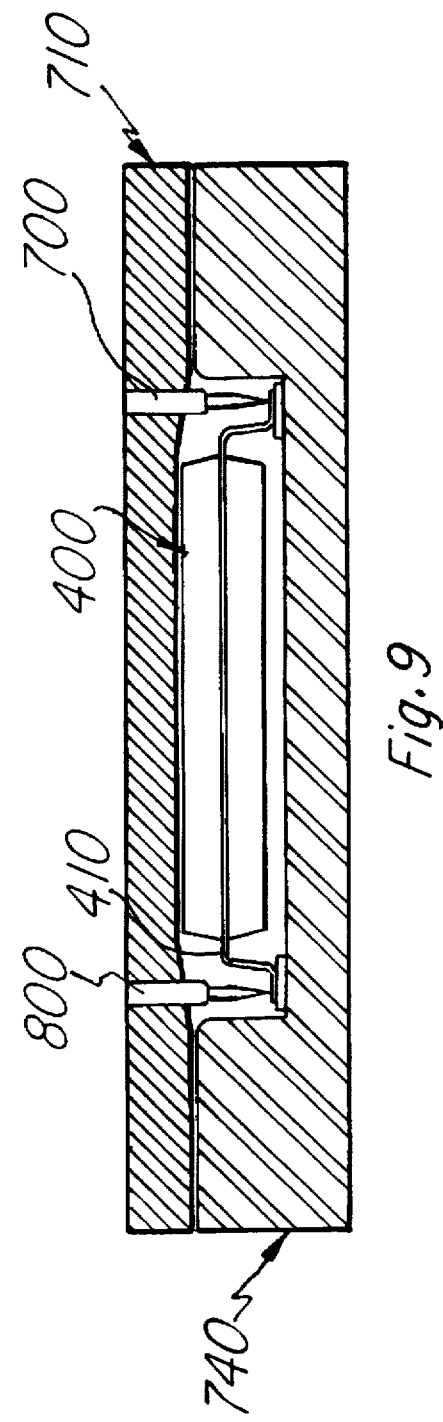

SOCKETLESS BURN-IN BOARD

This application is a Continuation of application Ser. No. 08/123,275, filed Sep. 17, 1993, now abandoned.

FIELD OF THE INVENTION

This invention relates to the burn-in procedure performed during semiconductor manufacturing and testing, and particularly relates to the burn-in boards used to perform the burn-in procedure.

DESCRIPTION OF THE RELATED ART

The burn-in procedure guarantees device reliability by stressing operating integrated semiconductor devices with elevated temperatures. In previous arrangements, the devices are inserted into sockets on printed circuit boards either manually or with automated insertion equipment. Each board carries an array of sockets and interconnecting printed circuit traces or electrical leads. The circuit boards and sockets form burn-in modules that are then plugged into edge connectors in a rack in an oven after being loaded with the devices to be tested. The edge connectors electrically connect the devices and sockets to test signal generating circuits proximate the oven. The oven is then closed to seal the devices in the oven while the ambient air in the oven is heated and the devices are operated by the test signal generator circuits. Unreliable devices fail and the rest of the devices are further tested and eventually sold.

A substantial part of the burn-in module cost is the cost of the socket. For example, the cost of sockets for a burn-in module which tests devices in Thin Small Outline Packages (TSOPs) makes up 70% of the total cost of the burn-in module. As device package pitches become finer, the socket design becomes more sophisticated in order to accommodate the smaller lead spacings and the increased number of leads. Therefore, the socket cost for the next generation of fine pitch packages will be even greater than the socket cost for the current generation of packages. As a result the cost of sockets will continue to represent a large part of the total burn-in module cost.

Another problem experienced with burn-in modules is that not all sockets are designed for automated loading and unloading. Even if the sockets used in the burn-in module are designed to enable automated loading and unloading, the requirements for automated loading and unloading can vary with each type and brand of socket. Therefore, companies can be required to invest in multiple types of automated loaders and unloaders when performing burn-in of devices with various package types.

There are still other disadvantages of burn-in modules. First, sockets create socket induced signal distortion and socket reliability penalties. Second, the use of sockets dictates the height of the burn-in module and as a result dictates the number of burn-in modules that a burn-in oven is able to accommodate. Third, socket widths are often greater than device widths; therefore, the number of devices tested per burn-in module are restricted by the extra board space needed to accommodate socket sizes.

SUMMARY OF THE INVENTION

The burn-in system of the present invention furnishes burn-in modules formed of pairs of printed circuit boards that are socketless. One of the boards contains printed circuit traces from one edge to plural positions on the board. Each position receives and holds one integrated semiconductor device. The traces at each position terminate in pads respectively located for connection to the proper leads of each device. The one board also furnishes certain structural configurations at each position to retain the devices laterally in place. The other board mounts on the one board to sandwich the devices between the boards and to clamp the devices to the trace pads at each position. This positively connects the devices to the circuit traces. All of the positions are free of sockets.

Alternatively the other board can also contain circuit traces or leads and connecting structures to connect with the leads of the clamped devices.

The structural configurations occur by way of recesses formed in the one and/or the other board created by etching or by a perforated panel overlaid on the one board to align the perforations with the positions and trace pads.

BRIEF DESCRIPTION OF THE DRAWINGS

FIG. 4 is a cross-sectional view of a portion of an assembled burn-in module clamping an integrated circuit in position.

FIG. 5 is a cross-sectional view of the lower socketless board taken along section line 5 of FIG. 2 with a device placed in a sitting position.

FIG. 9 is a cross-sectional view of an assembled burn-in module clamping an integrated circuit in place and thereby placing the upper socketless board in electrical contact with the device under test.

DETAILED DESCRIPTION

Figure 1:
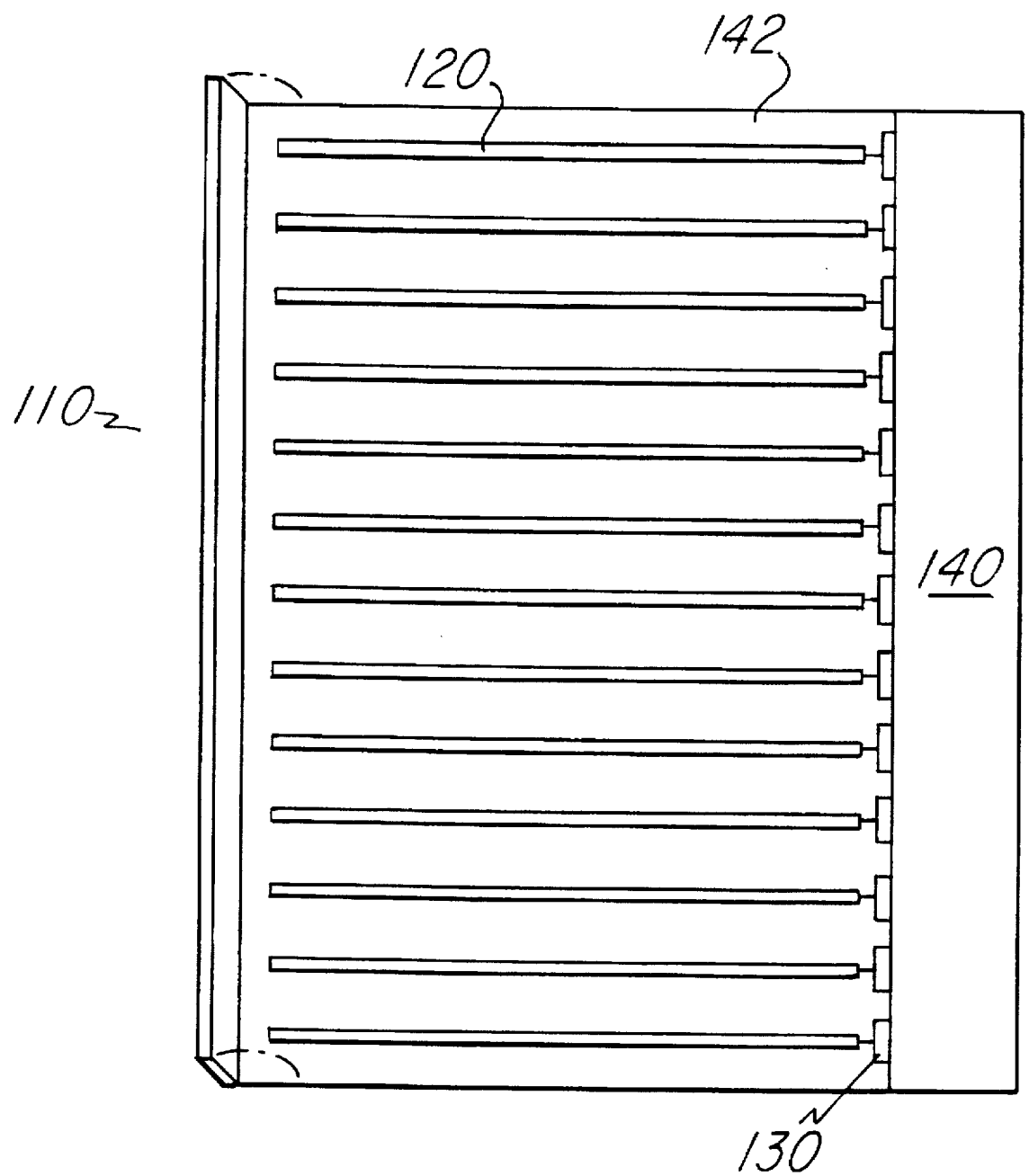
FIG. 1 is a view of a burn-in oven system of the invention.

The burn-in procedure used during semiconductor manufacturing and testing insures device reliability. In FIG. 1, the burn-in procedure is performed by using a burn-in oven system 110. Devices are loaded into sockets on printed circuit boards forming burn-in modules 120. Then the burn-in modules are loaded into the burn-in system 110 and become electrically connected to oven circuitry 140 via edge connectors, 130. The oven circuitry 140 generates test signals through the edge connectors 130 to the traces on the printed circuit boards of the burn-in modules. The traces route the test signals to the appropriate socket terminals for connection to the device leads. The system 110 then encloses the modules with a closeable housing 142 and heats the atmosphere in the housing while generating the test signals to the devices.

Figure 2:
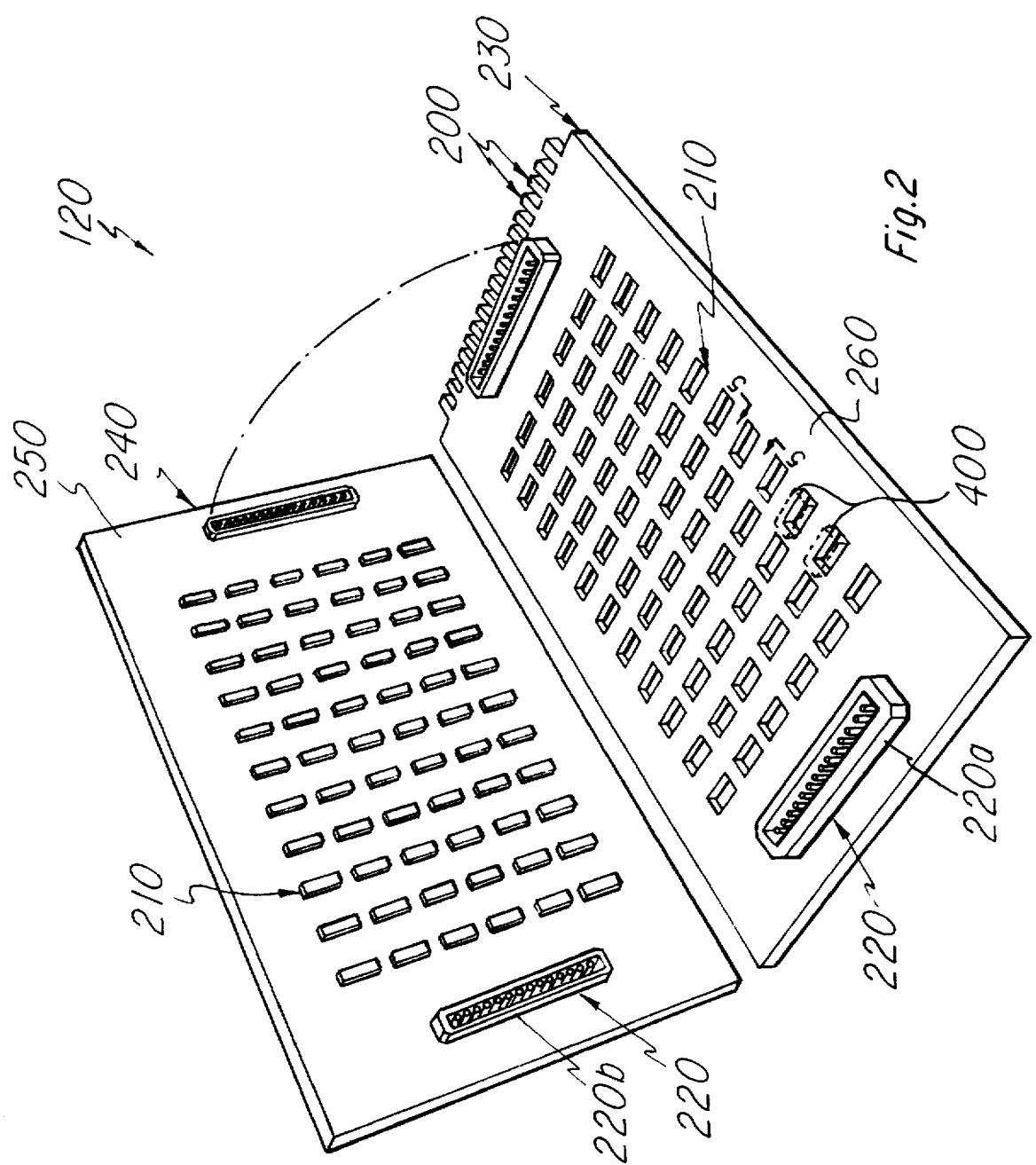
FIG. 2 is an idealized perspective view of a burn-in module constructed and arranged according to the invention.

In FIG. 2, socketless burn-in module 120 of the claimed invention includes 1) a lower socketless board 230 containing electrical traces or leads which route test signals to and from certain device sitting positions 210, 2) an upper socketless board 240 that covers the lower socketless board and helps to hold the devices in place, and 3) a connector 220 for fastening the lower socketless board to the upper socketless board.

The lower socketless board 230 is designed to have device sitting positions 210 instead of sockets. The device sitting position can be a depressions 210 formed in lower socketless board 230. Device sitting positions 210 can be formed by etching. Four substantially flat sidewalls and a substantially flat bottom surface create the device sitting positions 210. Each device sitting position holds one device to be tested. The device sitting positions also serve as a structure which retains the devices laterally in place.

Connector 220 fastens the face 250 of the upper socketless board to the face 260 of the lower socketless board and also clamps the devices 400 in their sitting positions. Connector 220 is comprised of two halves, the first half 220a fastened to the lower socketless board and the second half 220b fastened to the upper socketless board. These two halves are adapted to mount tightly together.

Clamping the devices between the upper socketless board 240 and the lower socketless board 230 also helps to keep devices 400 in the correct lateral position. Additionally, when the upper socketless board is fastened to the lower socketless board good contact between the device pins and the test signals is facilitated. Both of these functions were previously accomplished by the use of sockets.

Figure 3:
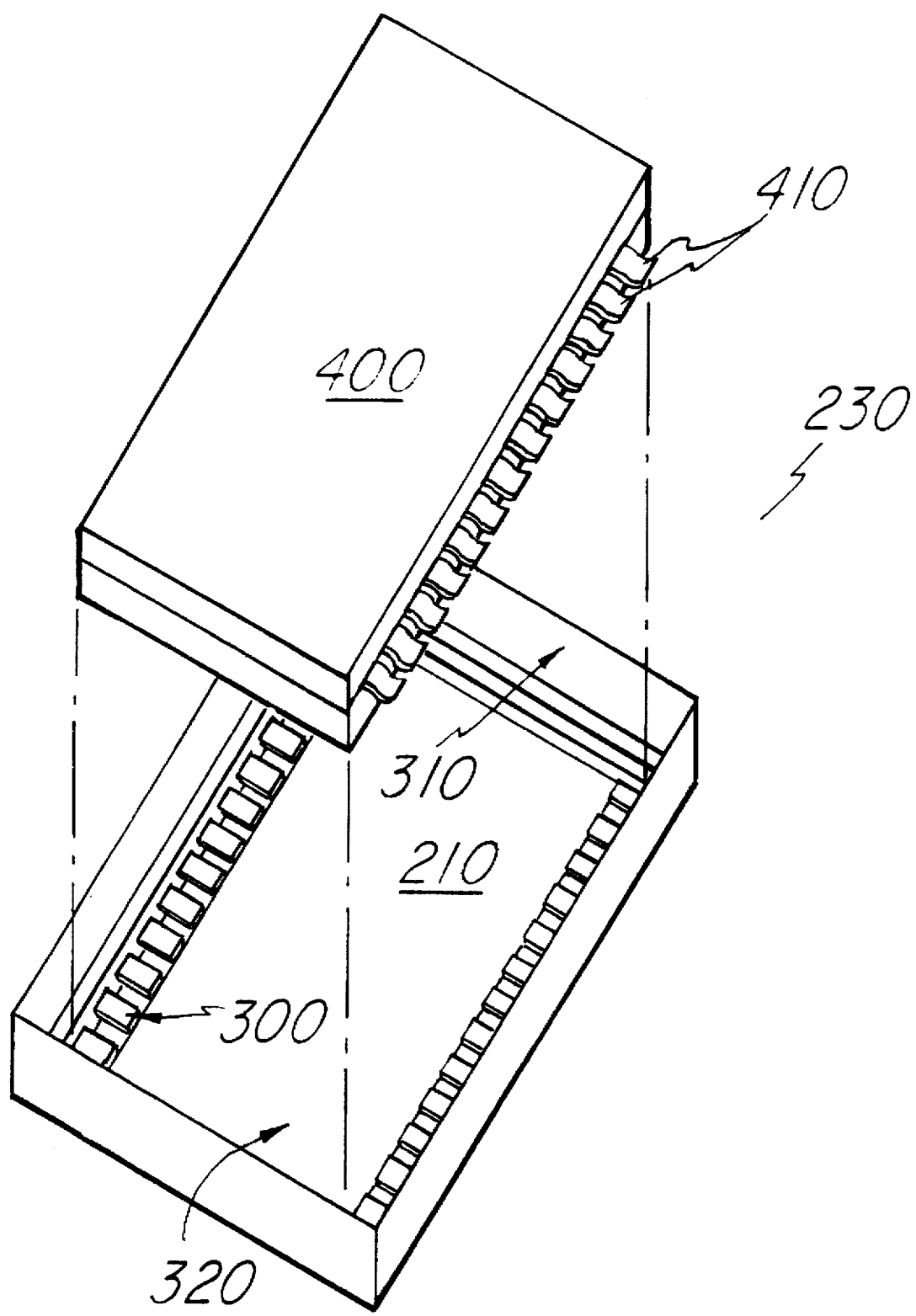
FIG. 3 is a idealized perspective view of a device sitting position of the lower socketless board arranged to receive an integrated circuit.

The lower socketless board contains electrical traces or leads running from end contact pads 200 to plural device sitting positions 210. In FIG. 3, the electrical leads terminate in contact pads 300. Contact pads 300 contact device leads 410 when devices are placed in the device sitting positions 210 and the upper socketless board is clamped to the lower socketless board. Four substantially flat sidewalls 310 and one substantially flat bottom surface 320 create device sitting positions 210.

In FIG. 4 the upper socketless board 240 fastens to the lower socketless board and forces the leads 410 of device 400 in good electrical contact with contact pads 300.

In FIG. 5 the lower socketless board 230 is generally a multi-layer printed circuit board (PCB) with signal planes or traces 500, a ground plane or trace 510, and a power plane or trace 520 bonded to insulation layers 530 with one of the insulating layers creating side walls 310. Electrical leads 500, 510, and 520 carry the test signals from the oven circuitry to device contact pads 300. The test signals enter device 400 when the device leads 410 make electrical contact with contact pads 300.

The device density of the burn-in module of the claimed invention is greater than burn-in modules using sockets because 1) the lower socketless board of the claimed invention has more area for signal traces because it doesn't have to provide for through holes for socket leads and 2) the board space isn't used by sockets whose width is often greater than the width of the device to be tested.

Figure 6:
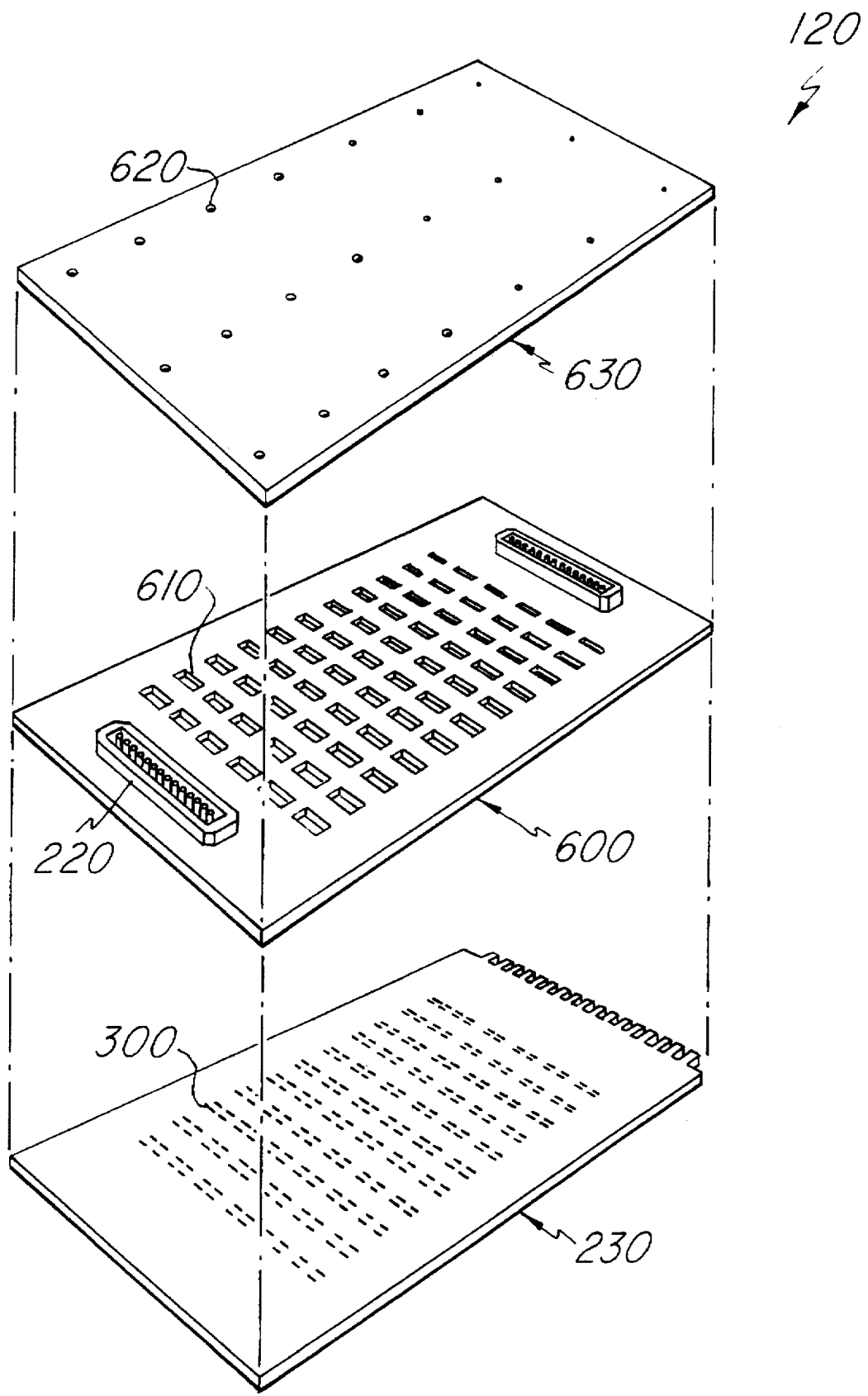
FIG. 6 is an idealized perspective view of a burn-in module with a high temperature resistant sheet.

In FIG. 6, another way of creating a device sitting position is to create a perforated sheet of high temperature resistant material 600 that adhesively mounts onto the lower socketless board 230. The perforations 610 of sheet 600 match the dimensions of the device packages. Sheet 600 should be thick enough to prevent the devices from shifting or misaligning laterally.

The upper socketless board 630 prevents devices 400 from vertical motion during transport. The upper socketless board sitting positions 210 can be a mirror image of the lower socketless board sitting positions 210. Device sitting positions 210 in the upper socketless board 630 may be either etched as depressions or formed using a high temperature sheet 610. Therefore, the only difference between the lower socketless board 230 and the upper socketless board 630 may be that signal traces including power and ground may not be contained in the upper socketless board 630 as they are in the lower socketless board 230.

Holes 620 may be drilled in the upper socketless board 630 to facilitate air ventilation. Alternatively, a net-like upper socketless board can be used to maximize air flow.

Figure 7:
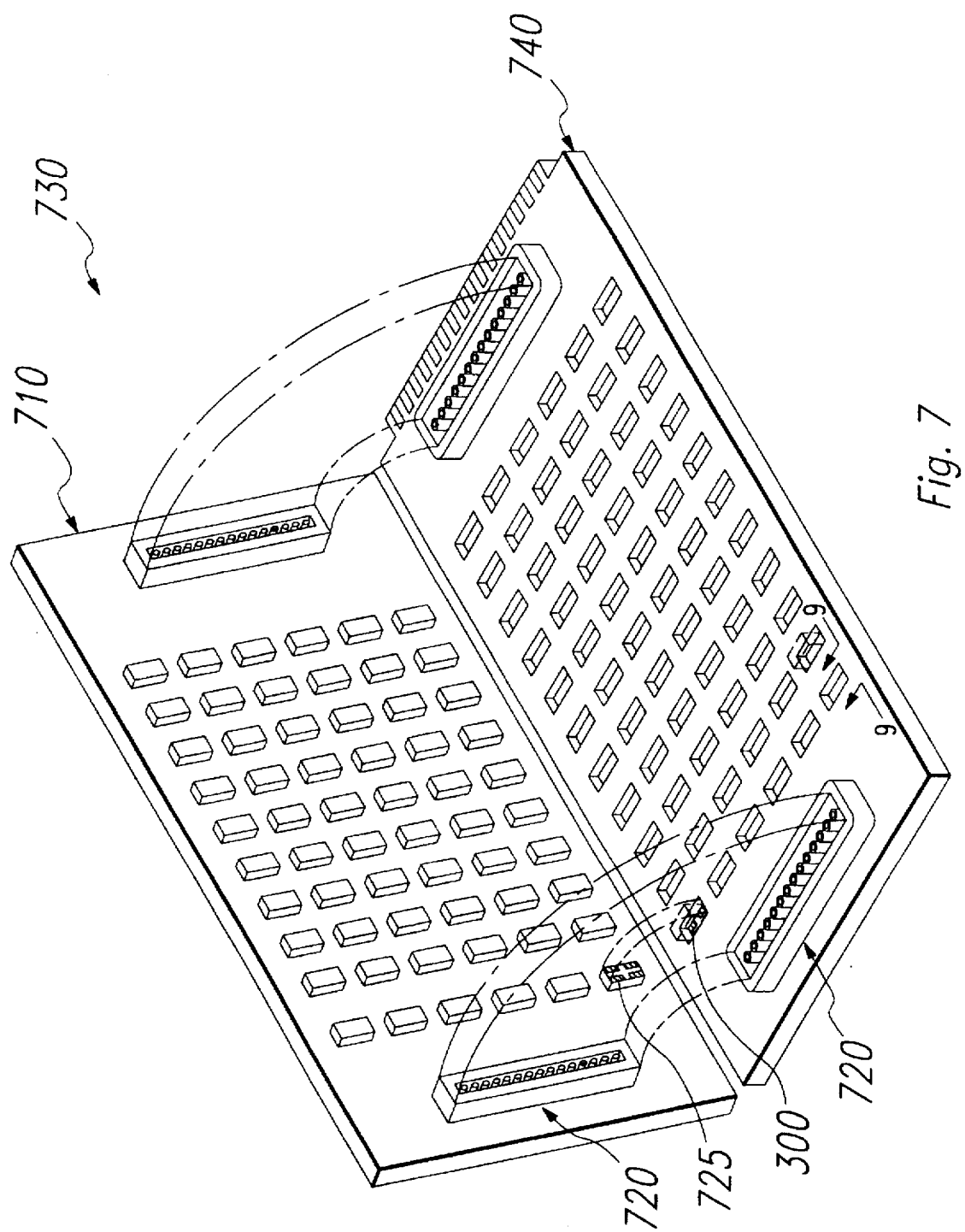
FIG. 7 is an idealized perspective of a burn-in module with the upper socketless board containing signal leads and connector pin locations.

In FIG. 7, the design of the upper socketless board 710 can be enhanced by constructing the upper socketless board 710 to contain electrical traces for carrying signals, including power and ground, to the leads of devices. Connector 720 is used to carry signals from the lower socketless board 740 to the upper socketless board 710. Connector 720 therefore serves the dual functions of mounting the lower socketless board to the upper socketless board and transferring signals from the lower socketless board to the upper socketless board. The electrical traces located in the upper socketless board 710 carry the signals to the connector pads 725 located in the upper board sitting positions 210.

By adding traces to the upper socketless board 710, the number of traces in the lower socketless board 740 can be reduced. Furthermore, adding traces to the upper socketless board could significantly increase the total amount of traces and, as a result, the device density of the burn-in module 730 can be increased up to 100%.

Figure 8:
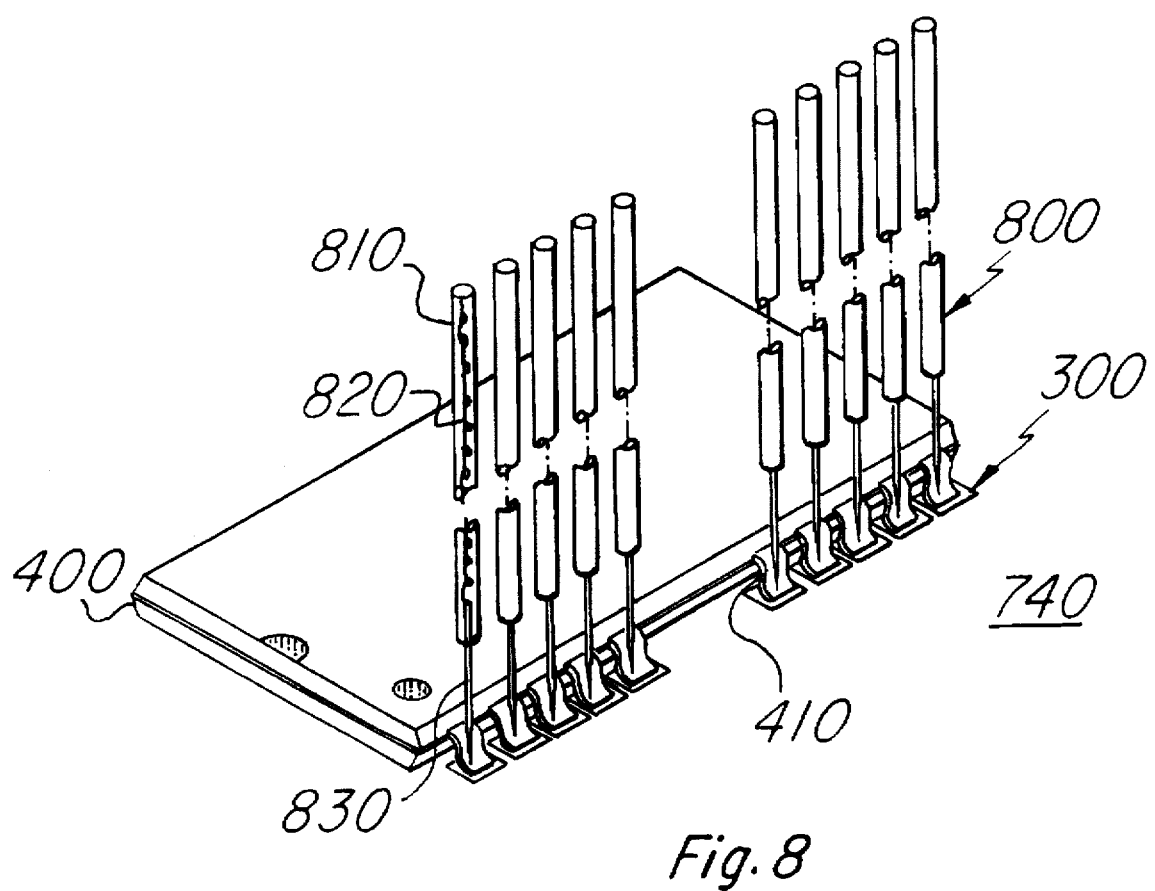
FIG. 8 is a idealized perspective view of connector pins from the upper socketless board in contact with device leads.

In FIG. 8, the signals carried by the traces of the upper socketless module 710 are rerouted to the devices via the connector pins 800. The upper socketless board 710 may be designed so that pins 800 make electrical contact to leads 410. Device pins 800 are commonly spring loaded to accommodate irregularities in leads 410. Device pin 800 includes an outter casing 810 and a spring 820 which applies pressure to inner pin 830.

In FIG. 9 the upper socketless board 710 contains connector pins 800 mounted in through holes 700. Because the upper socketless board 710 is fastened to the lower socketless board 740, connector pins 800 are in electrical contact with device 400 through device leads 410.

Some of the advantages of this invention are that 1) burn-in module cost is reduced dramatically because the need for sockets is extinguished, 2) eliminating sockets eliminates socket induced signal distortion and socket reliability penalties, 3) the number of devices tested per burn-in module can be increased, 4) burn-in module height without sockets is less than the height with sockets: therefore, more modules can fit into the burn-in oven system, 5) multiple automated loading and unloading machines which accommodate different package types is no longer necessary.

Modifications and variations of the invention are possible in light of the above teachings while remaining within the scope of the appended claims. For instance, test signals from the upper socketless board certain positions can be routed to device leads by the contact pins making an electrical connection to the lower socketless board contact pads 300 instead of the device leads 410 directly.

We claim:

1. A socketless burn-in module for testing devices having leads comprising:
a lower socketless board having a plurality of device positions for providing lateral support for said devices under test, said lower socketless board having a first end having end contact pads for coupling to a burn-in oven, said lower socketless board having electrical leads extending from said end contact pads to said device positions for routing signals from said end contact pads to said device positions, said device positions having a plurality of device contact pads adapted to connect to said device leads, all of said device positions being free of sockets;

an upper socketless board having device positions providing lateral support for said devices, said device positions of said upper socketless board being free of sockets; and a connector for coupling said lower socketless board to said upper socketless board.

2. The module of claim 1 in which each said device position includes a depression having four contiguous side walls and a bottom surface coupled to said side walls.

3. The module of claim 1 including a sheet mounted between said upper and said lower socketless boards, said sheet having openings defining said device positions and presenting side walls for said devices to extend through said openings in said sheet, and said side walls preventing excessive shifting of said devices.

4. The module of claim 1 in which said upper socketless board has passages facilitating air flow to cool said devices.

5. The module of claim 1 in which said upper socketless board has connector pads for coupling to said connector, and said upper socketless board has electrical leads extending from said connector pads to said device positions for routing signals from said connector pads to said device positions.

6. The module of claim 5 in which said upper socketless board has connector pins at said device positions for coupling said upper socketless board to said leads of said devices, said upper socketless board connector pins routing said signals from said device positions of said upper socketless board to said device leads.

7. The module of claim 5 in which said connector connects signals between said lower socketless board and said upper socketless board.

8. The module of claim 1 in which said connector includes a first half fastened to said lower socketless board and a second half fastened to said upper socketless board for engaging said first half.

* * * * *